US009966151B2

(12) United States Patent
Lee

(10) Patent No.: US 9,966,151 B2
(45) Date of Patent: May 8, 2018

(54) CURRENT SENSING CIRCUIT AND MEMORY DEVICE HAVING THE SAME

(71) Applicant: SK hynix Inc., Gyeonggi-do (KR)

(72) Inventor: Jung Hwan Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/188,710

(22) Filed: Jun. 21, 2016

(65) Prior Publication Data

US 2017/0221585 A1   Aug. 3, 2017

(30) Foreign Application Priority Data

Feb. 2, 2016  (KR) .......................... 10-2016-0012839

(51) Int. Cl.
| G11C 11/34 | (2006.01) |
| G11C 29/50 | (2006.01) |
| G06F 11/07 | (2006.01) |
| G11C 7/10 | (2006.01) |

(52) U.S. Cl.
CPC ............ *G11C 29/50* (2013.01); *G06F 11/079* (2013.01); *G06F 11/0727* (2013.01); *G06F 11/0751* (2013.01); *G06F 11/0793* (2013.01); *G11C 7/10* (2013.01); *G11C 2029/5006* (2013.01)

(58) Field of Classification Search
CPC .............................................. G11C 2029/5006
See application file for complete search history.

(56) References Cited

U.S. PATENT DOCUMENTS

| 6,859,401 | B2 * | 2/2005 | Hosono .............. | G11C 16/3436 365/185.17 |
| 2005/0286308 | A1 * | 12/2005 | Nagashima ............ | G11C 16/06 365/185.22 |
| 2013/0286746 | A1 * | 10/2013 | Choi .................. | G11C 16/0483 365/185.22 |
| 2015/0348633 | A1 * | 12/2015 | Song ..................... | G11C 16/12 365/185.19 |

FOREIGN PATENT DOCUMENTS

| KR | 1020130037059 | 4/2013 |
| KR | 1020130037064 | 4/2013 |

* cited by examiner

*Primary Examiner* — Uyen B Tran
(74) *Attorney, Agent, or Firm* — IP & T Group LLP

(57) ABSTRACT

There are provided a current sensing circuit and a memory device having the same. A current sensing circuit includes a current mirror unit suitable for outputting a first voltage and a second voltage; a chunk current controller suitable for generating the first voltage by generating a current through at least one page buffer; a fail bit counter suitable for adjusting a current at a first node where the first voltage is output in response to fail bits received from the page buffer; an allowed bit counter suitable for adjusting the current at the first node according to predetermined allowed bits; and a target range setting unit suitable for adjusting a current at a second node where the second voltage is output in response to a target code.

19 Claims, 6 Drawing Sheets

CURRENT SENSING CIRCUIT AND MEMORY DEVICE HAVING THE SAME

CROSS-REFERENCE TO RELATED APPLICATION

The present application claims priority under 35 U.S.C. 119(a) to Korean patent application number 10-2016-0012839 filed on Feb. 2, 2016, in the Korean Intellectual Property Office, the entire disclosure of which is incorporated herein in its entirety by reference.

BACKGROUND

Field of Invention

An aspect of the present disclosure relates generally to a current sensing circuit and a memory device having the same.

Description of Related Art

A memory device may include a memory cell array including a plurality of memory blocks in which data is stored, a peripheral circuit for performing a program, read, or erase operation of the memory cell array, and a control logic for controlling the peripheral circuit.

The peripheral circuit may include a voltage generation circuit for outputting various operation voltages, a row decoder for transmitting operation voltages to a selected memory block, a page buffer unit for arbitrarily storing data received from the selected memory block, a column decoder for transmitting data received from an external device to the page buffer unit or outputting the data arbitrarily stored in the page buffer unit to the external device, and an input/output circuit for transmitting/receiving data to/from the external device.

The control logic may control the peripheral circuit so that a program, read, or erase operation is performed in response to a command and an address received from the external device.

SUMMARY

Embodiments provide a current sensing circuit having improved reliability compared to existing current sensing circuits and a memory device having the same.

According to an aspect of the present disclosure, there is provided a current sensing circuit including: a current mirror unit suitable for outputting a first voltage and a second voltage; a chunk current controller suitable for generating the first voltage by generating a current through at least one page buffer; a fail bit counter suitable for adjusting a current at a first node where the first voltage is output in response to fail bits received from the page buffer; an allowed bit counter suitable for adjusting the current at the first node according to predetermined allowed bits; and a target range setting unit suitable for adjusting a current at a second node where the second voltage is output in response to a target code.

According to an aspect of the present disclosure, there is provided a memory device including: a memory cell array in which data is stored; at least one page buffer suitable for receiving data from the memory cell array through bit lines; a current sensing circuit suitable for receiving the data from the page buffer and output one of a pass signal and a fail signal according to fail bits included in the data; and a control logic suitable for controlling the page buffer and the current sensing circuit.

DETAILED DESCRIPTION

Figure 1:
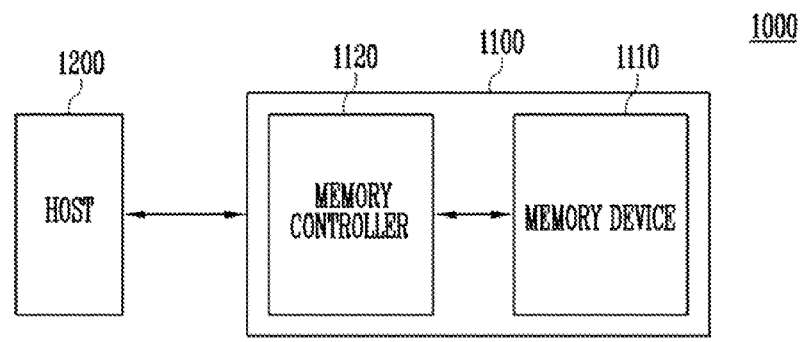
FIG. 1 is a diagram illustrating a memory system, according to an embodiment of the present invention

Hereinafter, exemplary embodiments of the present disclosure will be described in detail with reference to the accompanying drawings. However, the present disclosure is not limited to the embodiments but may be implemented into different forms. These embodiments a re provided only for illustrative purposes and for full understanding of the scope of the present disclosure by those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries should be interpreted as having a meaning that is consistent with their meaning in the context of the specification and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Referring now to FIG. 1 a memory system 1000 is provided, according to an embodiment of the present invention.

According to the embodiment of FIG. 1, the memory system 1000 may include a storage device 1100 and a host 1200 for controlling the storage device 1100. The storage device 1100 may include a memory device 1110 in which data is stored and a memory controller 1120 for controlling the memory device 1110.

The host 1200 may communicate with the storage device 1100 by using an interface protocol, such as, a peripheral component interconnect-express (PCI-E), an advanced technology attachment (ATA), a serial ATA (SATA), a parallel ATA (PATA), a serial attached SCSI (SAS), a universal serial bus (USB), a multi-media card (MMC), an enhanced small disk interface (ESDI), integrated drive electronics (IDE) and the like.

The memory controller 1120 controls operations of the storage device 1100, and data exchange between the host 1200 and the memory device 1110. For example, the memory controller 1120 may control the memory device 1110 in response to a write or read request received from the host 1200, thereby programming data into the memory device or reading data from the memory device.

According to an embodiment, the memory device 1110 may include one of a double data rate synchronous dynamic random access memory (DDR SDRAM), a low power double data rate 4 (LPDDR4) SDRAM, a graphics double data rate (GDDR) SRAM, a low power DDR (LPDDR) a rambus dynamic random access memory (RDRAM), and a flash memory.

Figure 2:
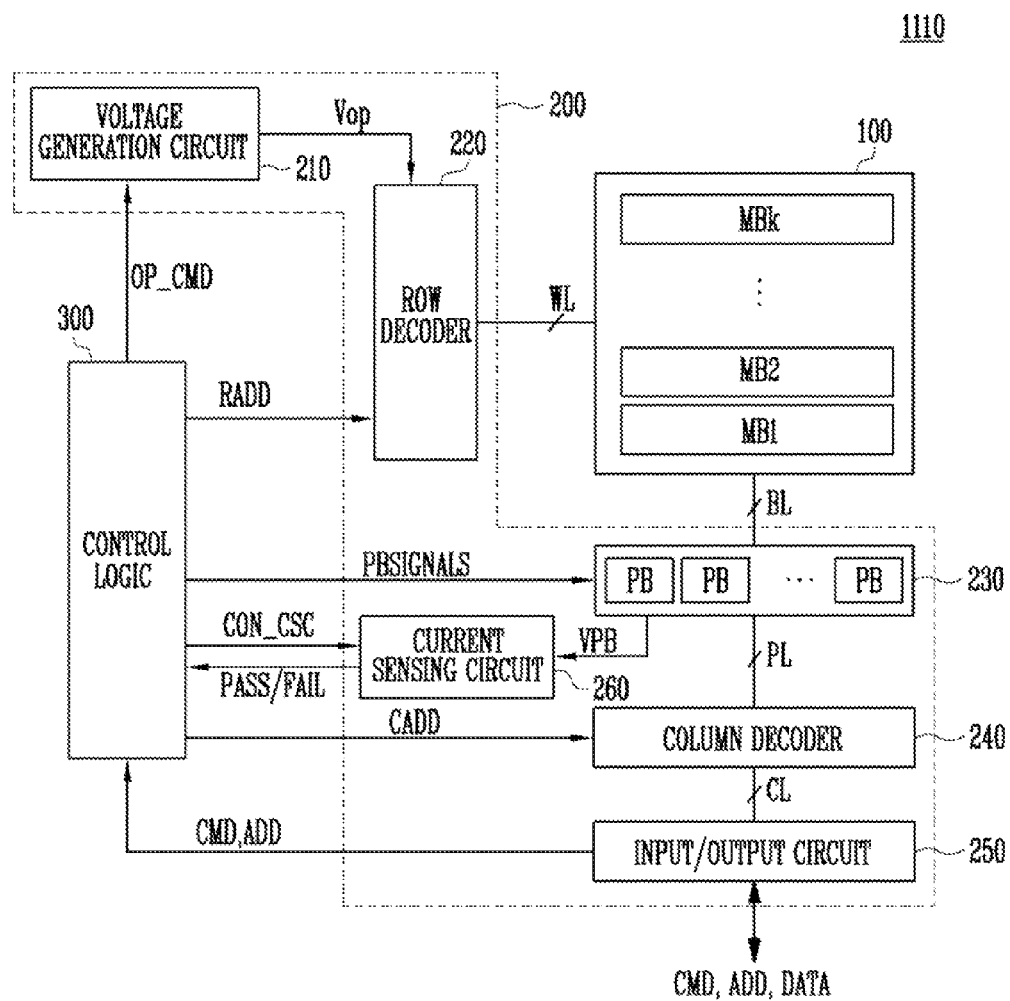
FIG. 2 is a diagram illustrating a configuration of a memory device employed in the memory system of FIG. 1, according to an embodiment of the present invention.

FIG. 2 is a diagram illustrating a configuration of the memory device 1110 of FIG. 1, according to an embodiment of the invention.

Referring to FIG. 2, a case where the memory device 1110 is a flash memory will be described as an example.

The memory device 1110 may include a memory cell array 100 in which data is stored a peripheral circuit 200 for programming data in the memory cell array 100, reading data stored in the memory cell array 100, and erasing data from the memory cell array 100, and a control logic 300 for controlling the peripheral circuit 200.

The memory cell array 100 may include a plurality of memory blocks MB1 to MBk wherein k is a positive integer. Word lines WL and bit lines BL are coupled to the memory blocks. The word lines WL may be respectively coupled to corresponding memory blocks, and the bit lines BL are commonly coupled to the memory blocks.

The peripheral circuit 200 may include a voltage generation circuit 210, a row decoder 220, a page buffer unit 230, a column decoder 240, an input/output circuit 250, and a current sensing circuit 260.

The voltage generation circuit 210 generates operation voltages Vop having various levels, used in program, read, and erase operations, in response to an operation signal $OP_{13}$ CMD received from the control logic 300. For example, the voltage generation circuit 210 may generate a program voltage, a read voltage, a pass voltage, a turn-on voltage, and the like. The generated operation voltages Vop are conveyed to the row decoder 220.

The row decoder 220 provides the operation voltages Vop to a word line WL coupled to a selected memory block in response to a row address RADD received from the control logic 300.

The page buffer unit 230 includes a plurality of page buffers PB coupled to the bit lines BL. The page buffers PB may arbitrarily store data received through the bit lines BL according to page buffer control signals PBSIGNALS. The page buffer control signals PBSIGNALS may a plurality of signals to control the page buffers PB.

The column decoder 240 transmits/receives data to/from the page buffers PB through page lines PL selected in response to a column address CADD.

The input/output circuit 250 transmits, to the control logic 300, a command CMD and an address ADD, which are received from the memory controller (e.g., 1120 of FIG. 1) or transmits/receives data to/from the column decoder 240 coupled through column lines CL.

In a verify operation, the current sensing circuit 260 receives page voltages VPB from the page buffer unit 230 in response to a sensing control signal CON_CSC received from the control logic 300, and outputs a pass signal PASS or a fail signal FAIL to the control logic 300 according to the received page voltages VPB. The current sensing circuit 260 is not limited to verify operation, and may be used in a read operation.

The control logic 300 controls the peripheral circuit 200 by outputting the operation signal OP_CMD, the row address RADD, page buffer control signals PBSIGNALS, and the sensing control signal CON_CSC in response to the command CMD and the address ADD received from the input/output circuit 250. For example, the control logic 300, in a verify operation, outputs the sensing control signal CON_CSC to the current sensing circuit 260, and may determine whether the verify operation has passed or failed in response to the pass signal PASS or fail signal FAIL output from the current sensing circuit 260.

Figure 3:
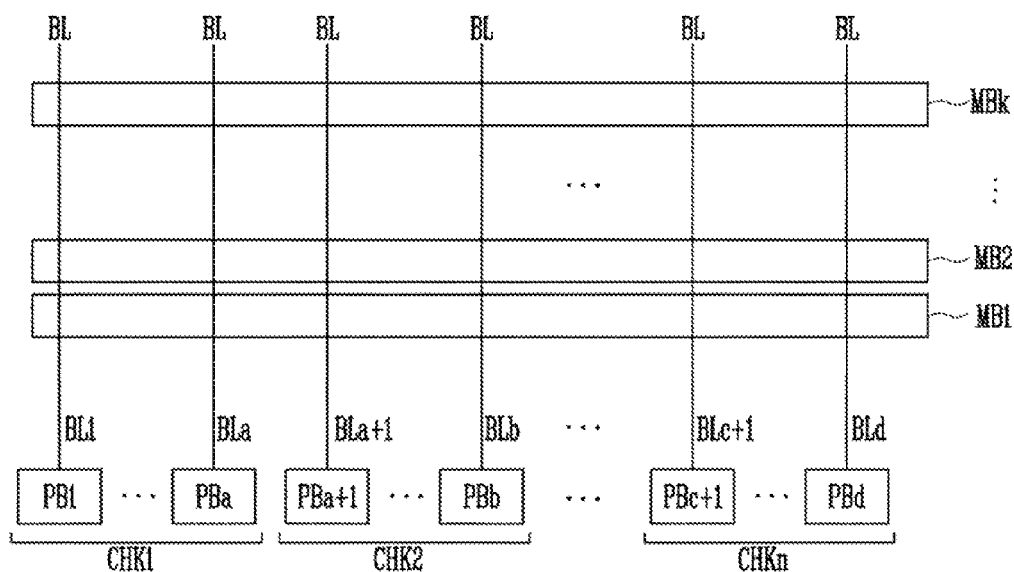
FIG. 3 is a diagram illustrating a page buffer unit of the memory device of FIG. 2, according to an embodiment of the present invention.

FIG. 3 is a diagram illustrating a configuration of the page buffer unit 230 of FIG. 2, according to an embodiment of the invention.

Referring to FIG. 3, the page buffer unit 230 includes a plurality of page buffers PB1 to PBa, PBa+1 to PBb, . . . , and PBc+1 to PBd. The page buffers PB1 to PBa, PBa+1 to PBb, . . . , and PBc+1 to PBd may be coupled to bit lines BL1 to BLa, BLa+1 to BLb, . . . , and BLc+1 to BLd, respectively. The page buffers PB1 to PBa, PBa+1 to PBb, . . . , and PBc+1 to PBd may arbitrarily store data received through the bit lines BL1 to BLa, BLa+1 to BLb, . . . , and BLc+1 to BLd, respectively.

The number of page buffers PB1 to PBa, PBa+1 to PBb, . . . , and PBc+1 to PBd included in the memory device (e.g., 1110 in FIG. 2) may be changed depending on a data storage capacity of the memory device. Recently, as the memory device becomes larger in capacity, the number of page buffers PB1 to PBa, PBa+1 to PBb, . . . , and PBc+1 to PBd has continuously increased. As the number of page buffers PB1 to PBa, PBa+1 to PBb, . . . , and PBc+1 to PBd increases, the page buffers PB1 to PBa, PBa+1 to PBb, . . . , and PBc+1 to PBd may be grouped in units of chunks. For example, a first chunk CHK1 may include a first page buffer PB1 to an ath page buffer PBa, a second chunk CHK2 may include an (a+1)th page buffer PBa+1 to a bth page buffer PBb, and an nth chunk CHKn may include a (c+1)th page buffer PBc+1 to a dth page buffer PBd. In a verify operation, a current sensing operation may be performed in units of chunks.

Figure 4:
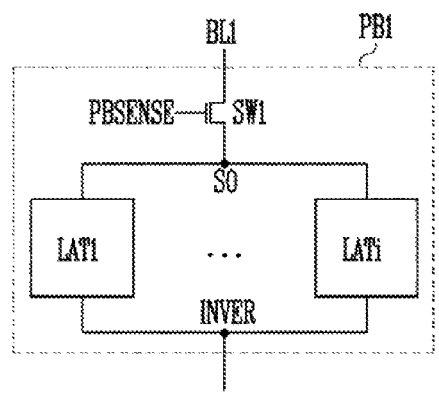
FIG. 4 is, a circuit diagram of a page buffer employed in the page buffer of FIG. 3, according to an embodiment of the present invention.

FIG. 4 is a diagram illustrating example configuration of the page buffer PB1 of FIG. 3.

The page buffers PB1 to PBa, PBa+1 to PBb, . . . , and PBc+1 to PBd shown in FIG. 3 may be configured identically to each other, and therefore, the first page buffer PB1 among the page buffers will be described as an example.

Referring to FIG. 4, the first Page buffer PB1 may include a switch SW1 for transmitting, to a sensing node So, data received through a first bit line BL1, and latches LAT1 to LATi (i is a positive integer) for arbitrarily latching or storing data loaded into the sensing node S0. The switch SW1 may be implemented as an NMOS transistor coupling the first bit line BL1 and the sensing node S0 to each other in response to a sensing signal PBSENSE. One node of each latch LAT1 to LATi may be coupled to the sensing node S0, while the other node of each latch LAT1 to LATi may be coupled to an internal node INVER. The potential at the sensing node S0 may be changed depending on data stored in the latches in a verify operation. The voltages of the internal nodes INVER and the sensing node S0 may be included in the page voltage VPB of FIG. 2.

Figure 5:
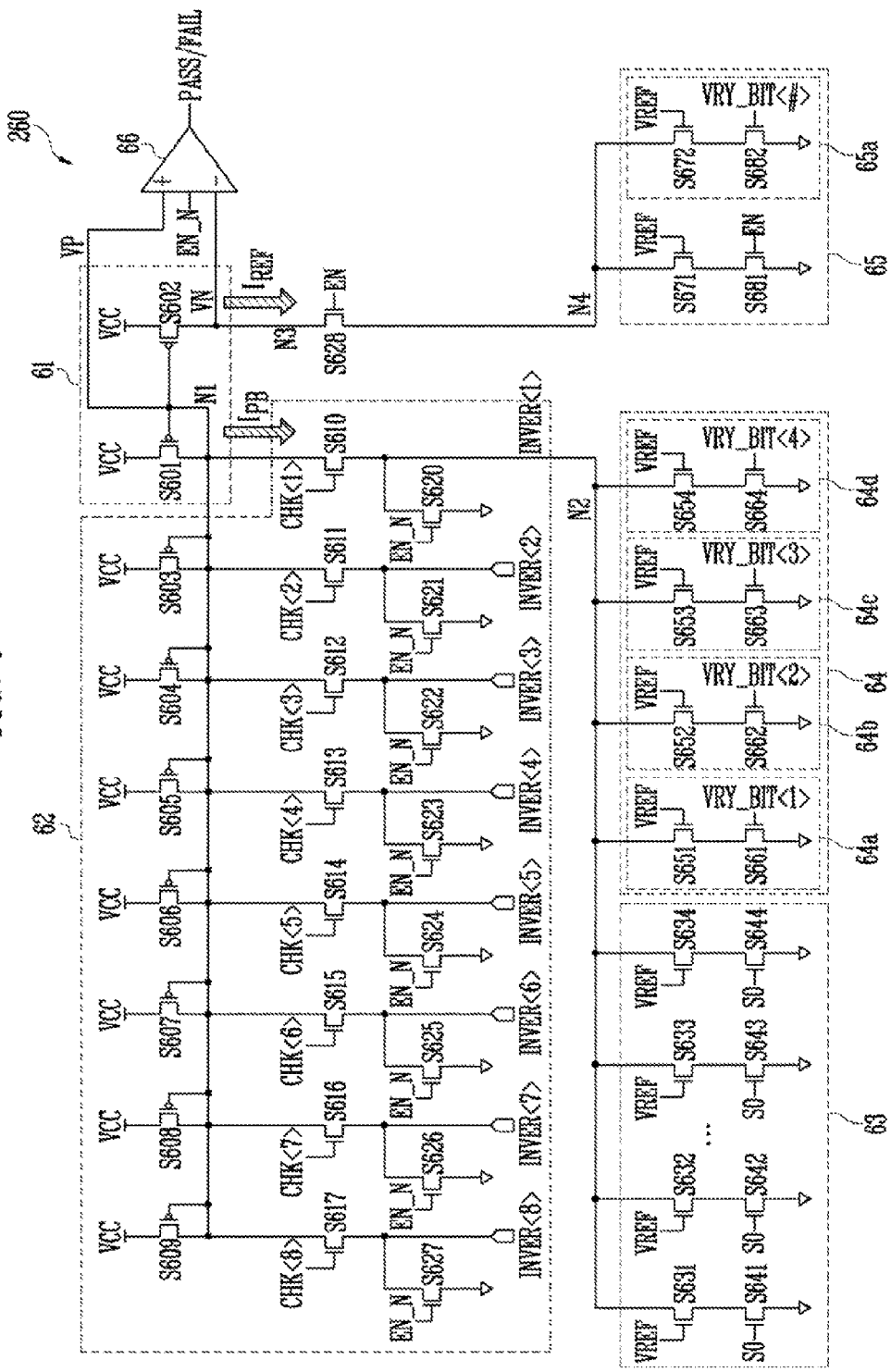
FIG. 5 is a diagram of a current sensing circuit of FIG. 2, according to an embodiment, of the present invention.

FIG. 5 is a diagram illustrating an example configuration of the current sensing circuit 260 of FIG. 2.

Referring to FIG. 5 the current sensing circuit 260 outputs a pass signal PASS when the number of fail bits is equal to or less than the number of allowed bits, and outputs a fail signal FAIL when the number of fail bits exceeds the number of allowed bits. To this end, the current sensing circuit 260 may include a current mirror unit 61, a chunk current controller 62, a switch S628, a fail bit counter 63, an allowed bit counter 64, a target range setting unit 65, and a comparison unit 66.

Whether the number of fail bits is equal to or less than the number of allowed bits or whether the number of fail bits exceeds the number of allowed bits may be determined by a difference between the amount of current $I_{PB}$ at a second node N2 and the amount of current $I_{REF}$ at a fourth node N4. In this embodiment, the amount of current $I_{REF}$ at the fourth node N4 may be fixed as a value set by the target range setting unit 65, and the amount of current $I_{PB}$ at the second node N2 may be varied depending on the number of fail bits received to the fail bit counter 63. For example, when assuming that switches included in the allowed bit counter 64 and the target range setting unit 65 have the same characteristic, the amount of current $I_{REF}$ at the fourth node N4 may be determined according to the number of turned-on switches among the switches included in the target range setting unit 65. Accordingly, the reference level of the amount of current $I_{PB}$ at the second node N2, by which pass or fail is determined, can be changed. For example, if the number of turned-on switches among switches included in the fail bit counter 63 is equal to or less than A (A is a positive integer), when A switches among the switches included in the allowed bit counter 64 are turned on, the amount of current $I_{PB}$ at the second node N2 is lower than the amount of current $I_{REF}$ at the fourth node N4, and therefore, the comparison unit 66 of the current sensing circuit 260 may output the pass signal PASS. If the number of turned-on switches among the switches included in the fail bit counter 63 exceeds A, the amount of current $I_{PB}$ at the second node N2 is higher than the amount of current $I_{REF}$ at the fourth node N4, and therefore, the comparison unit 66 of the current sensing circuit 260 may output the fail signal FAIL. The current sensing circuit 260 varies the amount of current $I_{PB}$ at the second node N2 depending on the number of fail bits, and fixes values of the allowed bit counter 64 and the target range setting unit 65, so that when the difference between the number of fail bits and the number of allowed bits is constant, each of the amount of current $I_{PB}$ at the second node N2 and the amount of current $I_{REF}$ at the fourth node N4 becomes constant. The configuration of each component of the current sensing circuit 260 will be described in detail as follows.

The current mirror unit 61 is configured to sense a basic current. For example, the current mirror unit 61 may include first and second switches S601 and S602 configured so that a current is generated at a first node N1 and a third node N3 in response to a potential at the first node N1. For example, the first switch S601 may be implemented as a PMOS transistor configured to couple a power voltage terminal VCC and the first node N1 to each other in response to the potential at the first node N1. More specifically, a drain terminal of the first switch S601 may be coupled to the power voltage terminal VCC, a gate terminal of the first switch S601 may be coupled to the first node N1, and a source terminal of the first switch S601 may be coupled to the first node N1. The second switch S602 may be implemented as a PMOS transistor configured to couple the power voltage terminal VCC and the third node N3 to each other in response to the potential at the first node N1. More specifically, a drain terminal of the second switch S602 may be coupled to the power voltage terminal VCC, a gate terminal of the second switch S602 may be coupled to the first node N1, and a source terminal of the second switch S602 may be coupled to the third node N3.

The chunk current controller 62 may be configured to supply potentials at internal nodes of page buffers to the first node N1 in units of chunks. For example, the chunk current controller 62 is coupled between the first node N1 and power voltage terminals VCC. The chunk current controller 62 may include a plurality of switches S603 to S609 turned on or turned off in response to the potential at the first node N1, a plurality of switches S610 to S617 configured to couple internal nodes INVER<1:8> included in chunks and the first node N1 to each other in response to chunk select signals CHK<1:8>, and a plurality of switches S620 to S627 configured to discharge nodes between the internal nodes INVER<1:8> and the plurality of switches S610 to S617 in response to an enable inversion signal EN_N.

For more detailed description, a case where page buffers are grouped into eight chunks will be described as an example.

The chunk current controller 62 may include first to ninth switches S603 to S609 configured to commonly couple the power voltage terminals VCC to the first node N1 in response to the potential at the first node N1. The first to ninth switches S603 to S609 may be implemented as PMOS transistors. Also, the chunk current controller 62 may include first to eighth chunk select switches S610 to S617 configured to couple first to eighth internal nodes INVER<1: 8> of first to eighth chunks to the first node N1 in response to first to eighth chunk select signals CHK<1:8>. The first to eighth chunk select switches S610 to S617 may be implemented as NMOS transistors. Among the first to eighth chunk select switches S610 to S617, the first chunk select switch S610 is disposed closest to the first switch S601 included in the current mirror unit 61, and the eighth chunk select switch S617 is disposed most distant from the first switch S601. The first internal node INVER<1> coupled to the first chunk select switch S610 is coupled to the second node N2. That is, the first chunk select switch S610 may couple the first node N1 and the second node N2 to each other in response to the first chunk select signal CHK<1>. The first internal node'INVER<1> means internal nodes INVER of the page buffers included in the first chunk (CHK1 of FIG. 3). Also, the chunk current controller 62 may include first to eighth enable switches S620 to S627 respectively coupled between the first to eighth chunk select switches S610 to S617 and the first to eighth internal nodes INVER<1:8>, the first to eighth enable switches S620 to S627 operating in response to the enable inversion signal EN_N. The first to eighth enable switches S620 to S627 may be implemented as NMOS transistors.

The ninth enable switch S628 is coupled between the third node N3 and the fourth node N4, and may be implemented as an NMOS transistor turned on or turned off in response to an enable signal EN.

The fail bit counter 63 is configured to vary the amount of current at the second node N2 depending on fail bits loaded into the sensing nodes S0 of the page buffers. The fail bit counter 63 includes reference voltage switches S631 to S634 and fail bit switches S641 to S644, which are coupled between the second node N2 and a ground terminal VSS. The reference voltage switches S631 to S634 may be coupled between the second node N2 and the ground terminal VSS while respectively forming pairs with the fail bit switches S641 to S644. For example, a first reference voltage switch S631 may form a pair with a first fail bit switch S641, and a second reference voltage switch S632 may form a pair with a second fail bit switch S642. The reference voltage switches S631 to S634 may be implemented as NMOS transistors commonly turned on or turned off in response to a reference voltage VREF. The fail bit switches S641 to S644 may be implemented as NMOS transistors selectively turned on or turned off in response to potentials at the sensing nodes S0 of the page buffers. For example, gates of the fail bit switches S641 to S644 may be coupled to the sensing nodes S0 of the page buffers, respectively. Thus, the fail bit counter 63 can include the reference voltage switches S631 to S634 and the fail bit switches S641 to S644 as many as the number of page buffers.

In a current sensing operation, the potential at the sensing node S0 of a page buffer for which the current sensing operation has failed becomes high, and the potential at the sensing node S0 of a page buffer for which the current sensing operation has passed becomes low. Thus, the number of turned-on fail bit switches among the fail bit switches S641 to S644 is in proportion to the number of fail bits.

The allowed bit counter 64 is configured to set a reference level with respect to the amount of current at the second node N2 according to a set number of allowed bits. The number of allowed bits may be differently set according to memory devices. The current sensing circuit 260 outputs the pass signal PASS when the number of fail bits is equal to or less than the number of allowed bits, and outputs the fail signal FAIL when the number of fail bits exceeds the number of allowed bits. The allowed bit counter 64 may include allowed bit circuit groups 64a, 64b, 64c, and 64d corresponding to various numbers of allowed bits. The allowed bit circuit groups 64a, 64b, 64c, and 64d may be coupled in parallel between the second node N2 and the ground terminal VSS. Particularly, the allowed bit circuit groups 64a, 64b, 64c, and 64d may be configured so that the amount of current at the second node N2 can be constantly maintained when the difference between the number of fail bits and the number of allowed bits is constant even though the number of fail bits and the number of allowed bits are varied.

A first allowed bit circuit group 64a among the allowed bit circuit groups 64a, 64b, 64c, and 64d is coupled between the second node N2 and the ground terminal VSS, and may include first allowed reference switches S651 and first allowed code switches S661, which have a first size. A second allowed bit circuit group 64b among the allowed bit circuit groups 64a 64b, 64c, and 64d is coupled between the second node N2 and the ground terminal VSS, and may include second allowed reference switches S652 and second allowed code switches S662, which have a second size greater than the first size. A third allowed bit circuit group 64c among the allowed bit circuit groups 64a, 64b, 64c, and 64d is coupled between the second node N2 and the ground terminal VSS, and may include third allowed reference switches S653 and third allowed code switches S663, which have a third size greater than the second size. A fourth allowed bit circuit group 64d among the allowed bit circuit groups 64a, 64b, 64c, and 64d is coupled between the second node N2 and the ground terminal VSS, and may include fourth allowed reference switches S654 and fourth allowed code switches S664, which have a fourth size greater than the third size.

The first to fourth allowed reference switches S651 to S654 may be implemented as NMOS transistors commonly operating in response to the reference voltage VREF. The first to fourth allowed code switches S661 to S664 may selectively operate in response to first to fourth allowed bit codes VRY_BIT<1:4>. For example, if the first to fourth allowed bit codes VRY_BIT<1:4> are '1000,' i.e., only the first allowed bit code VRY_BIT<1> is '1,' and the other second to fourth allowed bit codes VRY_BIT<2:4> are all '0', this means that only the first allowed bit circuit group 64a is activated. As another example, if the first to fourth allowed bit codes VRY_BIT<1:4> are '0100,' i.e., only the second allowed bit code VRY_BIT<2> is '1,' and the other first, third, and fourth allowed bit codes VRY_BIT<1,3,4> are all '0' this means that only the second allowed bit group 64b is activated.

Current flowing at the second node N2 is varied depending on the activated allowed bit circuit group among the first to fourth allowed bit circuit groups 64a to 64d. For example, the allowed bit counter 64 may vary the current at the second node N2 in inverse proportion to the fail bit counter 63. Specifically, if the number of fail bits exceeds the number of allowed bit numbers, the amount of current $I_{PB}$ at the second node N2 is increased by the fail bit counter 63. At this time, a change in the amount of current $I_{PB}$ at the second node N2, caused by the allowed bit counter 64, is constant, and therefore, the amount of current $I_{PB}$ at the second node N2 is varied by the fail bit counter 63. As the number of fail bits exceeds the number of allowed bit numbers and increases, the amount of current $I_{PB}$ at the second node N2 increases. However, when the difference between the number of fail bits and the number of allowed bits is constant, the amount of current $I_{PB}$ at the second node N2 can be always maintained constant. That is, if the difference between the number of fail bits and the number of allowed bits is constant, the amount of current $I_{PB}$ at the second node N2 is always constant even when different current sensing operations are performed.

The target range setting unit 65 is configured to vary the amount of current at the fourth node N4 depending on a set target range of the memory device. Here, the target range means a size equal to that of switches corresponding to the set number of allowed bits. The target range setting unit 65 may include a first target reference switch S671 and a tenth enable switch S681, which are coupled between the fourth node N4 and the ground terminal VSS, and a target setting circuit group 65*a*.

The first target reference switch S671 may be implemented as an NMOS transistor coupled between the fourth node N4 and the tenth enable switch S681 to operate in response to the reference voltage VREF. The tenth enable switch S681 may be implemented as an NMOS transistor coupled between the first target reference switch S671 and the ground terminal VSS to operate in response to the enable signal EN.

The target setting circuit group 65*a* is configured to vary the amount of current at the fourth node N4 depending on a set target range of the memory device. The target setting circuit group 65*a* may be coupled between the fourth node N4 and the ground terminal VSS. The target setting circuit group 65*a* may include second target reference switches S672 and target code switches S682, which are coupled between the fourth node N4 and the ground terminal VSS and have a target size. The second target reference switches S672 may be implemented as NMOS transistors operating in response to the reference voltage VREF. The target code switches S682 may be implemented as NMOS transistors operating in response to a target bit code VRY_BIT<#>. The target bit code VRY_BIT<#> is applied to the target code switches S682 in synchronization with the allowed bit codes VRY_BIT<1:4> applied to the allowed bit counter 64. The target bit code VRY_BIT<#> may be set such that the number of bits is varied depending on the number of the target code switches S682, and the target code switches S682 are simultaneously turned on. The target setting circuit group 65*a* varies the amount of current at the fourth node N4 depending on the set target range. Hence, if the target range is set, the amount of current at the fourth node N4 becomes constant.

As described above, in different current sensing operations in which the difference between the number of fail bits and the number of allowed bits is constant, the amount of current $I_{PB}$ at the second node N2 and the amount of current $I_{REF}$ at a fourth node N4 are constant, and thus a first voltage VP at the first node N1 coupled to the second node N2 and a second voltage VN at the third node N3 coupled to the fourth node N4 become constant.

The comparison unit 66 may include an operational amplifier as a comparator configured to output the pass signal PASS or the fail signal FAIL by comparing the first voltage VP and the second voltage VN in response to the enable inversion signal EN_N. The first voltage VP is applied to a non-inversion terminal (+) of the comparator, and the second voltage VN is applied to an inversion terminal (−) of the comparator. The pass signal PASS is output when the number of fail bits is equal to or less than the number of allowed bits, and the fail signal FAIL is output when the number of fail bits exceeds the number of allowed bits. For example, the pass signal PASS may be output when the first voltage VP is higher than the second voltage VN, and the fail signal FAIL may be output when the first voltage VP is lower than the second voltage VN. Therefore, the pass signal PASS may be output as a high-level signal, and the fail signal FAIL may be output as a low-level signal. A case where each of the pass signal PASS and the fail signal FAIL is output will be described as follows.

Since the reference voltage VREF as a positive voltage is activated in a current sensing operation, the reference voltage switches S631 to S634, the allowed reference switches S651 to S654, the first target reference switch S671, and the second target reference switches S672, which are included in the fail bit counter 63, the allowed bit counter 64, and the target range setting unit 65, are all turned on. Accordingly, the amount of current $I_{PB}$ at the second node N2 and the amount of current $I_{REF}$ at the fourth node N4 may be varied depending on operations of the fail bit switches S641 to S644, the allowed code switches S661 to S664, the tenth enable switch S681, and the target code switches S682.

In the allowed bit counter 64, a predetermined number of the allowed code switches S661 to S664 is turned on according to a set allowed code, and therefore, the amount of current $I_{PB}$ at the second node N2 is varied by the fail bit counter 63.

When the number of fail bits is equal to or less than the number of allowed bits, the number of turned-on fail bit switches S641 to S644 is small, and therefore, the amount of current $I_{PB}$ at the second node N2 is decreased. If the amount of current $I_{PB}$ at the second node N2 is decreased, the amount of current $I_{PB}$ at the first node N1 is also decreased, and therefore, the first voltage VP at the first node N1 is increased. If the first voltage VP at the first node N1 is increased, the turn-on level of the second switch S602 is decreased, and therefore, the second voltage VN at the third node N3 is decreased. Accordingly, the comparison unit 66 can output the pass signal PASS having a high level.

When the number of fail bits exceeds the number of allowed bits, the number of turned-on fail bit switches S641 to S644 is large, and therefore, the amount of current $I_{PB}$ at the second node N2 is increased. If the amount of current $I_{PB}$ at the second node N2 is increased, the amount of current $I_{PB}$ at the first node N1 is also increased, and therefore, the first voltage VP at the first node N1 is decreased. If the first voltage VP at the first node N1 is decreased, the turn-on level of the second switch S602 is increased, and therefore, the second voltage VN at the third node N3 is increased. Accordingly, the comparison unit 66 can output the pass signal PASS having a low level.

The above-described first to eighth chunk select signals CHK<1:8>, enable signal EN, enable inversion signal EN_N, reference voltage VREF, first to fourth allowed bit codes VRY_BIT<1:4>, and target bit code VRY_BIT<#> may be included in the sensing control signal (CON_CSC of FIG. 2). The above-described voltages of the internal nodes INVER and the sensing nodes S0 may be included in the page voltage (VPB of FIG. 2).

Each of the allowed bit counter 64 and the target range setting unit 65 among the components of the above-described current sensing circuit 260 will be described in detail as follows.

Figure 6:
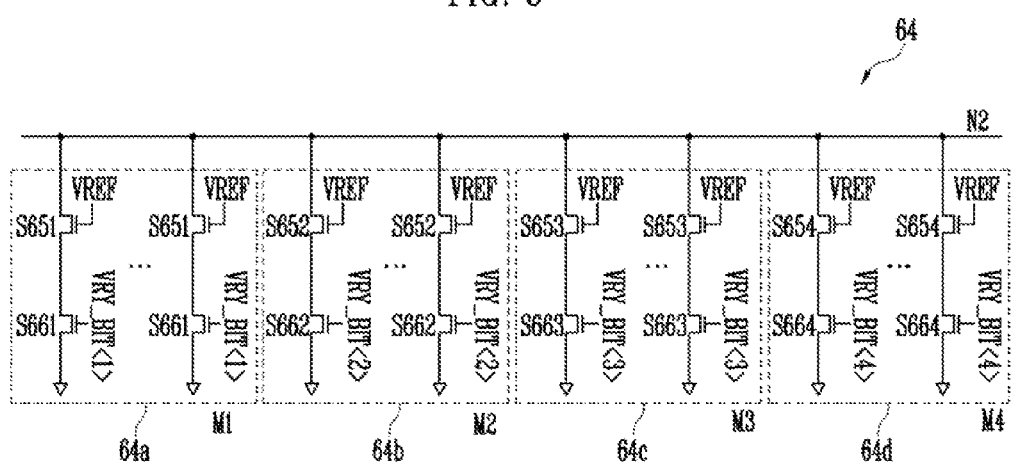
FIG. 6 is a diagram illustrating an allowed bit counter employed in the current sensing circuit of FIG. 5, according to an embodiment of the present invention.

FIG. 6 is a diagram illustrating the allowed bit counter 64 of FIG. 5, according to an embodiment of the invention Referring to FIG. 6, the allowed bit counter 64 may include the allowed bit circuit groups 64*a*, 64*b*, 64*c*, and 64*d* corresponding to various numbers of allowed bits. The allowed hit circuit groups 64a, 64b, 64c, and 64d may be coupled in parallel to each other between the second node N2 and the ground terminal VSS, and the number of the allowed bit circuit groups 64a, 64b, 64c, and 64d may be changed depending on a memory device.

The first allowed bit circuit group 64a is coupled between the second node N2 and the ground terminal VSS, and may include the first allowed reference switches S651 and the first allowed code switches S661, which have a first size M1. For example, the first allowed reference switches S651 and the first allowed code switches S661 may be implemented as NMOS transistors having the first size M1.

The second allowed bit circuit group 64b is coupled between the second node N2 and the ground terminal VSS, and may include the second allowed reference switches S652 and the second allowed code switches S662, which have a second size M2 greater than the first size M1. For example, the second allowed reference switches S652 and the second allowed code switches S662 may be implemented as NMOS transistors having the second size M2 twice greater than the first size M1.

The third allowed bit circuit group 64c is coupled between the second node N2 and the ground terminal VSS, and may include the third allowed reference switches S653 and the third allowed code switches S663, which have a third size M3 greater than the second size M2. For example, the third allowed reference switches S653 and the third allowed code switches S663 may be implemented as NMOS transistors having the third size M3 twice greater than the second size M2.

The fourth allowed bit circuit group 64d is coupled between the second node N2 and the ground terminal VSS, and may include the fourth allowed reference switches S654 and the fourth allowed code switches S664, which have a fourth size M4 greater than the third size M3. For example, the fourth allowed reference switches S654 and the fourth allowed code switches S664 may be implemented as NMOS transistors having the fourth size M4 twice greater than the third size M3.

The number of the first to fourth allowed reference switches S651 to S654 and the first to fourth allowed code switches S661 to S664, included in the first to, fourth allowed bit circuit groups 64a, 64b, 64c, and 64d may be set differently depending on a memory device.

Figure 7:
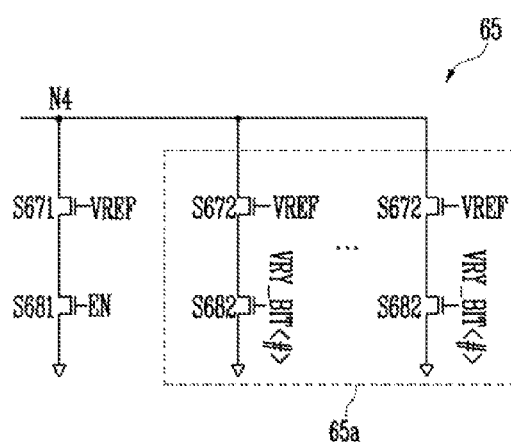
FIG. 7 is a diagram illustrating a target range setting unit employed in the current sensing circuit of FIG. 5, according to an embodiment of the present invention.

Referring to FIG. 7, the target range setting unit 65, according to an embodiment of the invention, may include the first target reference switch S671, the tenth enable switch S681, and the target setting circuit group 65a which are coupled between the fourth node N4 and the ground terminal VSS.

The first target reference switch S671 and the tenth enable switch S681 are coupled in series to each other between the fourth node N4 and the ground terminal VSS, and may be implemented as NMOS transistors having the first size M1.

The target setting circuit group 65a may be implemented as NMOS transistors having the same size as a selected allowed bit circuit group among the first to fourth allowed bit circuit groups 64a to 64d. For example, when it is set that the second allowed bit circuit group 64b among the first to fourth allowed bit circuit groups 64a to 64d is selected, the NMOS transistors included in the second allowed bit circuit group 64b have the second size M2, and therefore, the target setting circuit group 65a may also include NMOS transistors having the size M2.

Figure 8:
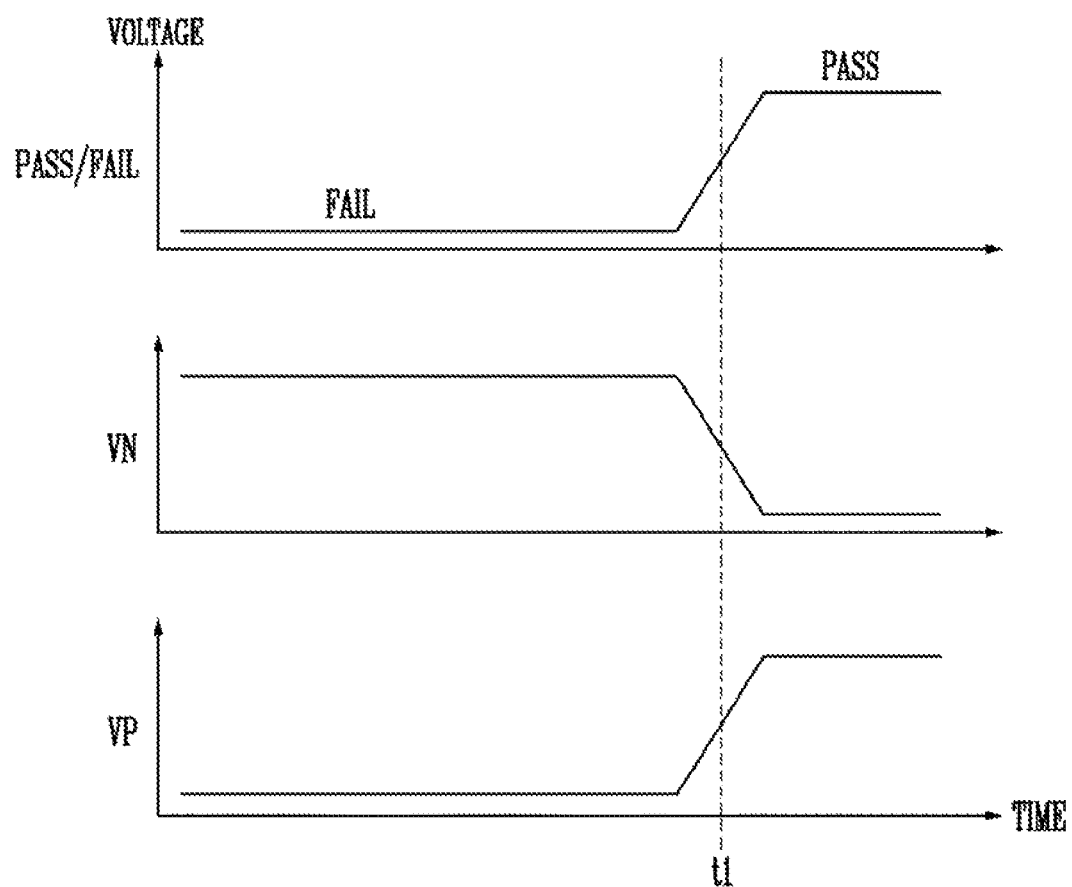
FIG. 8 is a diagram illustrating effects of the present invention.

Referring to FIG. 8, if the first voltage VP is lower than the second voltage VN (before t1), the current sensing circuit 260 in FIGS. 2 and 5 can constantly output the fail signal FAIL having a low level. If the first voltage VP is higher than the second voltage VN (after t1), the current sensing circuit 260 can constantly output the pass signal PASS having a high level. Particularly, although a plurality of current sensing operations are performed, the current sensing circuit 260 can output constant first and second voltages VP and VN in current sensing operations in which the difference between the number of fail bits and the number of allowed bits is constant, thereby improving the reliability of the current sensing circuit 260.

Figure 9:
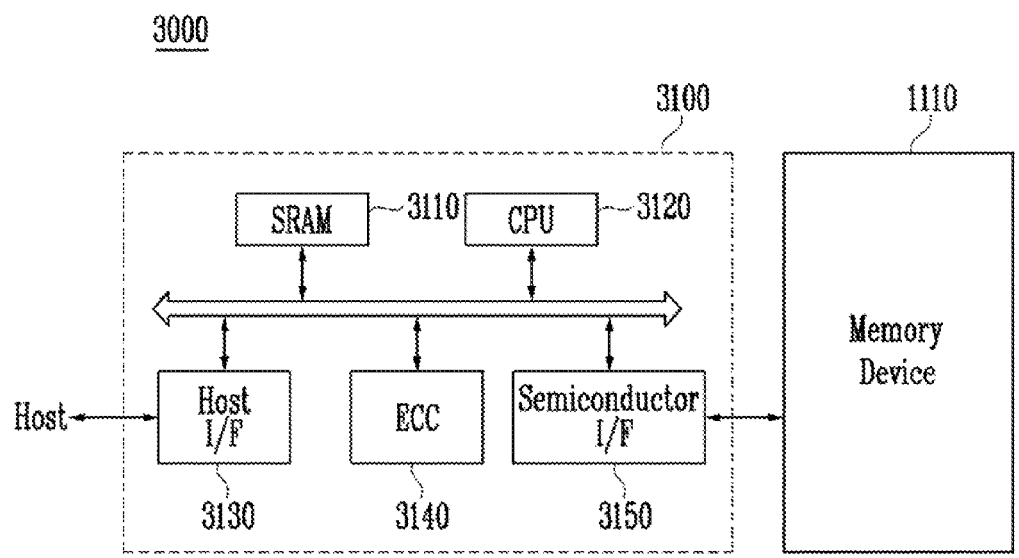
FIG. 9 is a block diagram illustrating a memory system including a memory device according to an embodiment of the present invention.

FIG. 9 is a block diagram illustrating a memory system 3000 including a memory device 1110 and a controller 3100, according to an embodiment of the present invention.

A memory device 1110 may be configured substantially identical to that of FIG. 2, and therefore detailed description of the memory device 1110 will be omitted.

Referring to FIG. 9, the controller 3100 may be configured to control the memory device 1110. The controller 3100 may include a static random access memory (SRAM) 3110, a central processing unit 3120 a host interface (I/F) 3130, error correction circuit (ECC) 3140, and a semiconductor interface 3150. The SRAM may be used as a working memory of the central processing unit (CPU) 3120. The host interface (I/F) 3130 may provide a data exchange protocol for the communication with a host coupled to the memory system 3000. The ECC 3140 may detect and correct errors included in data read out from the memory device 1110. The semiconductor interface (I/F) 3150 may interface with the memory device 1110. The CPU 3120 may perform a control operation for data exchange of the controller 3100. Although not shown in FIG. 9, the memory system 3000 may further include a read only memory (ROM) (not shown) for storing code data for interfacing with the host.

The memory system 3000 may be applied to a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 10:
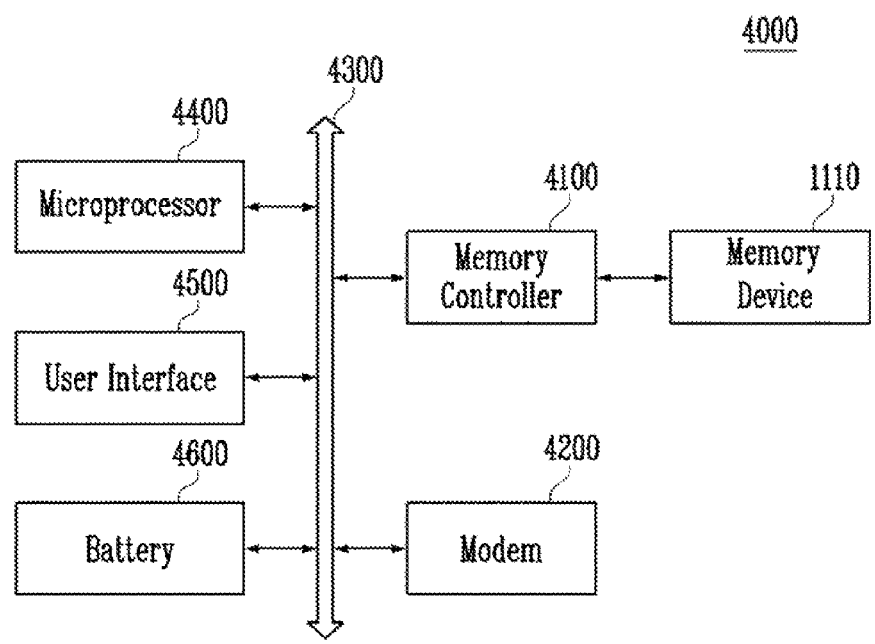
FIG. 10 is a diagram illustrating a computing system including a memory device, according to an embodiment of the present invention.

FIG. 10 is a diagram illustrating a computing system 4000 including a memory device 1110, according to an embodiment of the present invention.

According to the embodiment of FIG. 10, the computing system 4000 may include the memory device 1110, a memory controller 4100, a modem 4200, a microprocessor 4400, and a user interface 4500, which are electrically coupled to a bus 4300. When the computing system 4000 is a mobile device, a battery 4600 for supplying operation voltages of the computing system 4000 may be additionally provided In the computing system 4000. Although not shown in FIG. 10, the computing system 4000 may further include an application chip set, a camera image processor (CIS), a mobile dynamic random access memory (DRAM), and the like.

The memory device 1110 may be configured substantially identical to that of FIG. 2, and therefore, detailed description of the memory device 1110 will be omitted.

The controller 4100 and the memory device 1110 may constitute a solid state drive (SSD).

The system according to the present disclosure may be packaged in various forms, such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi-chip package (MCP), wafer-level fabricated package (WFP), or wafer-level processed stack package (WSP).

According to the present disclosure a current sensing circuit is provided having improved reliability over existing current sensing circuits. Accordingly, the reliability of a memory device having the same may also be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A current sensing circuit comprising:
   a current mirror unit suitable for outputting a first voltage and a second voltage;
   a chunk current controller suitable for generating the first voltage by generating a current through at least one page buffer;
   a fail bit counter suitable for adjusting a current at a first node where the first voltage is output in response to fall bits received from the page buffer;
   an allowed bit counter suitable for adjusting the current at the first node according to predetermined allowed bits; and
   a target range setting unit suitable for adjusting a current at a second node where the second voltage is output in response to a target code.

2. The current sensing circuit of claim 1, wherein the fail bit counter includes:
   a plurality of reference voltage switches coupled to the first node; and
   a plurality of fail bit switches coupled between the reference voltage switches and a ground terminal.

3. The current sensing circuit of claim 2, wherein the reference voltage switches include NMOS transistors commonly operating in response to a reference voltage.

4. The current sensing circuit of claim 2, wherein the fail bit switches include NMOS transistors selectively are turned on in response to the fail bits received from the page buffer.

5. The current sensing circuit of claim 1, wherein the allowed bit counter includes allowed bit circuit groups corresponding to various numbers of allowed bits.

6. The current sensing circuit of claim 5, wherein the allowed bit circuit groups are coupled in parallel to each other between the first node and a ground terminal.

7. The current sensing circuit of claim 5, wherein each f the allowed bit circuit groups include:
   a plurality of allowed reference switches coupled to the first node; and
   a plurality of allowed code switches coupled between the allowed reference switches and a ground terminal.

8. The current sensing circuit of claim 7, wherein the allowed reference switches and the allowed code switches, which are coupled between the first node and the ground terminal, form pairs, respectively.

9. The current sensing circuit of claim 8, wherein the allowed reference switches and the allowed code switches, which form the pairs, respectively, include NMOS transistors having various sizes.

10. The current sensing circuit of claim 9, wherein the NMOS transistors included in the allowed reference switches commonly operate in response to a reference voltage.

11. The current sensing circuit of claim 9, wherein the N MOS transistors included in the allowed code switches are selectively turned on in response to an allowed bit code.

12. The current sensing circuit of claim 11, wherein the allowed reference switches implemented to have a same size in response to the allowed bit code among the allowed reference itches are simultaneously turned on, and other allowed reference switches are turned off.

13. The current sensing circuit of claim 1, wherein the target range setting unit includes:
   a target reference switch coupled between the second node and a ground terminal;
   an enable switch coupled between the target reference switch and the ground terminal; and
   a target setting circuit group coupled between the second node and the ground terminal.

14. The current sensing circuit of claim 13, wherein the target reference switch includes an NMOS transistor operating in response to a reference voltage.

15. The current sensing circuit of claim 13, wherein the enable switch includes an NMOS transistor operating in response to an enable signal.

16. The current sensing circuit of claim 13, wherein the target setting circuit group includes:
   target reference switches coupled to the second node, the target reference switches simultaneously operating in response to a reference voltage; and
   target code switches coupled between the target, reference switches and the ground terminal, the target code switches operating in response to a target bit code.

17. The current sensing circuit of claim 16, wherein the target bit code is applied to the target code switches in synchronization with the allowed bit code applied to the allowed bit counter.

18. The current sensing circuit of claim 1, further comprising a comparison unit configured to output a pass signal or a fail signal by comparing the first voltage and the second voltage.

19. The current sensing circuit of claim 18, wherein the comparison unit includes a comparator having a non-inversion terminal to which the first voltage is applied and an inversion terminal to which the second voltage is applied, the comparator outputting the pass signal or the fail signal in response to an enable inversion signal.

* * * * *